United States Patent
Corrion et al.

(10) Patent No.: US 8,980,759 B1
(45) Date of Patent: Mar. 17, 2015

(54) METHOD OF FABRICATING SLANTED FIELD-PLATE GAN HETEROJUNCTION FIELD-EFFECT TRANSISTOR

(71) Applicant: HRL Laboratories, LLC, Malibu, CA (US)

(72) Inventors: Andrea Corrion, Oak Park, CA (US); Joel C. Wong, Los Angeles, CA (US); Keisuke Shinohara, Thousand Oaks, CA (US); Miroslav Micovic, Thousand Oaks, CA (US); Ivan Milosavljevic, Thousand Oaks, CA (US); Dean C. Regan, Simi Valley, CA (US); Yan Tang, Oak Park, CA (US)

(73) Assignee: HRL Laboratories, LLC, Mallbu, CA (US)

( * ) Notice: Subject to any disclaimer, the term of this patent is extended or adjusted under 35 U.S.C. 154(b) by 0 days.

(21) Appl. No.: 14/284,905

(22) Filed: May 22, 2014

(51) Int. Cl.
| | |
|---|---|
| *H01L 21/302* | (2006.01) |
| *H01L 29/40* | (2006.01) |
| *H01L 29/66* | (2006.01) |
| *H01L 21/3065* | (2006.01) |
| *H01L 29/20* | (2006.01) |

(52) U.S. Cl.
CPC ........ *H01L 29/402* (2013.01); *H01L 29/66462* (2013.01); *H01L 21/3065* (2013.01); *H01L 29/2003* (2013.01)
USPC ...................... 438/713; 438/607; 257/E21.24

(58) Field of Classification Search
USPC .................... 438/293; 257/E21.221, E21.222
See application file for complete search history.

(56) References Cited

U.S. PATENT DOCUMENTS 7,501,669 B2  3/2009  Parikh et al.
2009/0267116 A1  10/2009  Wu et al.

OTHER PUBLICATIONS

U.S. Appl. No. 14/014,915, filed Aug. 30, 2013, Corrion et al.
U.S. Appl. No. 14/014,930, filed Aug. 30, 2013, Corrion et al.
Y.-F. Wu, et al., "30-W/mm GaN HEMTs by Field Plate Optimization", IEEE Electron Device Letters, vol. 25, No. 3, Mar. 2004, pp. 117-119.
Wataru Saito et al., "High Breakdown Voltage AlGaN—GaN Power-HEMT Design and High Current Density Switching Behavior", IEEE Transactions on Electronic Devices, vol. 50, No. 12 Dec. 2003, pp. 2528-2531.
H. Xing et al. in "High Breakdown Voltage AlGaN—GaN HEMTs Achieved by Multiple Field Plates", IEEE Electron Device Letters, vol. 25, No. 4 Apr. 2004 pp. 161-163.
Y. Dora et al. In "High Breakdown Voltage Achieved on AlGaN/GaN HEMTs with Integrated Slant Field Plates", IEEE Electron Device Letters, vol. 27, No. 9 Sep. 2006 pp. 713-715.
Y.Pei, et al., "Deep-Submicrometer AlGaN/GaN HEMTs With Slant Field Plates", IEEE Electron Device Letters, vol. 30, No. 4, Apr. 2009, pp. 328-330.
Kengo Kobayashi et al., "Current Collapse Suppression in AlGaN/GaN HEMTs by Means of Slant Field Plates Fabricated by Multilayer SiCN", ISDRS 2013, Dec. 11-13, 2013.

*Primary Examiner* — Cheung Lee
(74) *Attorney, Agent, or Firm* — Ladas & Parry (57) ABSTRACT

A method of forming a slanted field plate including forming epitaxy for a FET on a substrate, forming a wall near a drain of the FET, the wall comprising a first negative tone electron-beam resist (NTEBR), depositing a dielectric over the epitaxy and the wall, the wall causing the dielectric to have a step near the drain of the FET, depositing a second NTEBR over the dielectric, wherein surface tension causes the deposited second NTEBR to have a slanted top surface between the step and a source of the FET, etching anisotropically vertically the second NTEBR and the dielectric to remove the second NTEBR and to transfer a shape of the slanted top surface to the dielectric, and forming a gatehead comprising metal on the dielectric between the step and the source of the FET, wherein the gatehead forms a slanted field plate.

23 Claims, 10 Drawing Sheets

METHOD OF FABRICATING SLANTED FIELD-PLATE GaN HETEROJUNCTION FIELD-EFFECT TRANSISTOR

STATEMENT REGARDING FEDERAL FUNDING

This invention was made under U.S. Government contract FA8650-11-C-7181, awarded by DARPA. The U.S. Government has certain rights in this invention.

CROSS REFERENCE TO RELATED APPLICATIONS

None

TECHNICAL FIELD

This disclosure relates to field plates to reduce electric fields in a field effect transistor (FET).

BACKGROUND

It is well-known that a peak in the electric field at the drain edge of the gate contact can limit the breakdown voltage of FETs. In GaN FETs, the high electric fields in this region also commonly result in electron trapping in surface states and may also result in electron trapping in the buffer, barrier, or passivation layers of the device, resulting in a virtual gate and reducing the on-state current of the device during high-voltage dynamic operation, known as "current collapse" or increased dynamic on-resistance. These issues can be mitigated through the use of field plates, which distribute the electric field over a larger area in the gate-drain region of the device, therefore reducing the peak field intensity. In the prior art high-voltage GaN devices have typically utilized one or more gate or source connected planar field plates. Planar field plates result in a non-optimal electric field profile with one or more peaks, limiting the high-voltage performance of the device.

The prior art includes conventional single field-plate GaN FETs, multiple field-plate GaN FETs, and slant gate FETs.

Y. F. Wu et al. in "30-W/mm GaN HEMTs by Field Plate Optimization", IEEE Electron Device Letters, Vol. 25, No. 3 (2004) describe a single planar gate-connected field-plate. The primary disadvantage of this approach is a non-optimum electric field profile due to single planar field plate.

Saito et al. in "High Breakdown Voltage AlGaN—GaN Power-HEMT Design and High Current Density Switching Behavior", IEEE Transactions on Electronic Devices, Vol. 50, No. 12 (2003) describe a single planar source-connected field plate. Field plate design and optimization are limited in this approach due to the planar field-plate and discontinuity between gate and field-plate, resulting in a non-optimal electric field profile.

H. Xing et al. in "High Breakdown Voltage AlGaN—GaN HEMTs Achieved by Multiple Field Plates", IEEE Electron Device Letters, Vol. 25, No. 4 (2004) describe a planar multiple gate connected field plate structure. The disadvantages include planar field plates and separation between the field plates by supporting dielectric layers, which limits field plate design and results in non-optimum electric field profile, and multiple metallization steps.

Wu et al. in "Wide bandgap transistors with multiple field plates", US 2009/0267116 A1 (2009) describe several multiple-field-plate GaN FET designs with planar gate and source-connected field plates separated by supporting dielectric layers. The disadvantages of these approaches include planar field-plates and separation between the field plates by supporting dielectric layers, which result in a non-optimal electric field profile.

Parikh et al. in "Wide bandgap transistor devices with field plates" U.S. Pat. No. 7,501,669 B2 (2009) describe several multiple-field-plate GaN FET designs. The disadvantages of these approaches include planar field-plates and separation between the field plates by supporting dielectric layers, which result in a non-optimal electric field profile.

U.S. patent application Ser. No. 14/014,915, filed Aug. 30, 2013 and U.S. patent application Ser. No. 14/014,930, filed Aug. 30, 2013 describe methods of fabricating multi-stepped gate field plates. The stepped field plates have a disadvantage of having a non-optimal electric field profile.

A slant field plate has been suggested as a way to effectively suppress the RF dispersion and the parasitic capacitance. However, fabrication of a slant field plate with a designed shape has been very challenging.

Y. Dora et al. in "High Breakdown Voltage Achieved on AlGaN/GaN HEMTs with Integrated Slant Field Plates", IEEE Electron Device Letters, Vol. 27, No. 9 (2006) describe a slanted gate field plate to reduce the peak electric field in the device. The disadvantages of this approach include a symmetric gate profile, which increases parasitic Cgs and limits the source-gate spacing, and poor process control over slant gate angle and gate length.

Other references describing slant field plates include: Y. Pei, Z. Chen, D. Brown, S. Keller, S. P. Denbaars, and U. K. Mishra "Deep-Submicrometer AlGaN/GaN HEMTs With Slant Field Plates", and K. Kobayashi, S. Hatakeyama, T. Yoshida, D. Piedra, T. Palacios, T. Otsuji, and T. Suemitsu "Current Collapse Suppression in AlGaN/GaN HEMTs by Means of Slant Field Plates Fabricated by Multi-layer SiCN".

In the prior art slant field plate are formed by utilizing the lateral etching property of an isotropic dry etch process. However, a limited lateral etch rate as compared to the vertical etch rate during the isotropic dry etch results in a steep angle in the sloped dielectric structure, which may be typically greater than 45 degrees. This steep angle limits flexibility in field plate design. Also, it is more difficult to control the field plate structure because the angle of the sloped dielectric is controlled by combination of lateral and vertical etch processes.

What is needed is an improved method of fabricating slanted field-plates. The embodiments of the present disclosure answer these and other needs.

SUMMARY

In a first embodiment disclosed herein, a method of forming a slanted field plate comprises forming epitaxy for a field effect transistor (FET) on a substrate, forming a wall on the epitaxy near a drain of the FET, the wall comprising a first negative tone electron-beam resist, depositing a dielectric over the epitaxy and the wall, the wall causing the dielectric to have a step near the drain of the FET, depositing a second negative tone electron-beam resist over the dielectric, wherein surface tension causes the deposited second negative tone electron-beam resist to have a slanted top surface between the step and a source of the FET, etching anisotropically vertically the second negative tone electron-beam resist and the dielectric to remove the second negative tone electron-beam resist and to transfer a shape of the slanted top surface to the dielectric between the step and the source of the FET, and forming a gatehead comprising metal on the dielectric between the step and the source of the FET, wherein the gatehead forms a slanted field plate.

In another embodiment disclosed herein, a method of forming a slanted field plate comprises forming epitaxy for a field effect transistor (FET) on a substrate, depositing first dielectric on the epitaxy by plasma-enhanced chemical vapor deposition (PECVD), the first dielectric having a thickness corresponding to a desired maximum slant height, depositing a second dielectric on the first dielectric to form a wall near a drain of the FET, depositing a negative tone electron-beam resist on the first and the second dielectric, wherein surface tension causes the deposited negative tone electron-beam resist to have a slanted top surface between the wall and a source of the FET, etching anisotropically vertically the negative tone electron-beam resist, the first dielectric and the second dielectric to remove the negative tone electron-beam resist and to transfer a shape of the slanted top surface to the first dielectric between the wall and the source of the FET, and forming a gatehead comprising metal on the dielectric between the wall and the source of the FET, wherein the gatehead forms a slanted field plate.

In yet another embodiment, a method of forming a slanted field plate comprises forming epitaxy for a field effect transistor (FET) on a substrate, depositing a first dielectric on the epitaxy, forming first negative tone electron-beam resist on the first dielectric near a source of the FET, depositing second dielectric over the first dielectric and the first negative tone electron-beam resist, planarizing the second dielectric and the first negative tone electron-beam resist using chemical-mechanical polishing (CMP), forming second negative tone electron-beam resist on the over the first negative tone electron-beam resist and the second dielectric near a source of the FET, the second negative tone electron-beam resist having a longer lateral length than the first negative tone electron-beam resist, depositing third dielectric over the second dielectric and the second negative tone electron-beam resist, planarizing the third dielectric and the second negative tone electron-beam resist using chemical-mechanical polishing (CMP), removing the first negative tone electron-beam resist and the second negative tone electron-beam resist by wet etching, wherein the second dielectric forms a first step from the first dielectric, and the third dielectric forms a second step from the second dielectric, depositing third negative tone electron-beam resist over the first, second and third dielectric, wherein surface tension causes the deposited third negative tone electron-beam resist to have a slanted top surface between the first step and a source of the FET, and between the second step and the first step, etching anisotropically vertically the third negative tone electron-beam resist and the first, second and third dielectric to remove the third negative tone electron-beam resist and to transfer a shape of the slanted top surface to the first, second and third dielectric between the second step and the source of the FET, and forming a gatehead comprising metal on the first, second and third dielectric between the second step and the source of the FET, wherein the gatehead forms a slanted field plate.

In still yet another embodiment, a method of forming a slanted field plate comprises forming epitaxy for a field effect transistor (FET) on a substrate, depositing a dielectric on the epitaxy, forming a first negative tone electron-beam resist on the dielectric near a drain of the FET to form a first step, depositing second negative tone electron-beam resist dielectric over the first negative tone electron-beam resist and near a drain of the FET to form a second step, the second negative tone electron-beam resist having a lateral length less than the first negative tone electron-beam resist, depositing third negative tone electron-beam resist over the first and second negative tone electron-beam resist, wherein surface tension causes the deposited third negative tone electron-beam resist to have a slanted top surface between the first step and a source of the FET, and between the second step and the first step, etching anisotropically vertically the first, second and third negative tone electron-beam resist to remove the first, second and third negative tone electron-beam resist and to transfer a shape of the slanted top surface to the dielectric between the second step and the source of the FET, and forming a gatehead comprising metal on the dielectric between the second step and the source of the FET, wherein the gatehead forms a slanted field plate.

These and other features and advantages will become further apparent from the detailed description and accompanying FIG.s that follow. In the FIG.s and description, numerals indicate the various features, like numerals referring to like features throughout both the drawings and the description.

DETAILED DESCRIPTION

In the following description, numerous specific details are set forth to clearly describe various specific embodiments disclosed herein. One skilled in the art, however, will understand that the presently claimed present disclosure may be practiced without all of the specific details discussed below. In other instances, well known features have not been described so as not to obscure the present disclosure.

The present disclosure describes a slanted field plate for removing the sharp electric field peaks formed at the edge of each field plate in a conventional multiple field plate structure, which lead to an increased breakdown voltage of the transistor. The dynamic on resistance, device on-resistance seen during high voltage switching operation, may also be decreased by a smooth electric field distribution achieved with a slanted field plate structure. Furthermore, the parasitic gate capacitance is minimized by the sloped field plate structure, leading to high switching speed when the device is used for power switches and high frequency high-efficiency operation when used for power amplifiers.

In an embodiment of the present disclosure, an entire sloped field plate may be defined with one etch step, which reduces processing time compared to conventional multiple field plate structures that require multiple lithography and etch steps to form each field plate. This embodiment utilizes the physical phenomena of the resist surface tension to create a slope useable for translating into a dielectric. A negative tone e-beam definable resist, such as hydrogen silsesquioxane (HSQ), is used to create a sloped feature. A "wall" created by depositing SiN on HSQ is used to create a raised "wall" between the gate and the drain and is significant in controlling and preventing cracking between multiple HSQ layers. This embodiment inherently increases the HSQ thickness in certain areas to provide a linear rather than exponential slope. The range of the slope can also be adjusted by the "wall" height and the degree to which the HSQ is diluted.

Figure 1:
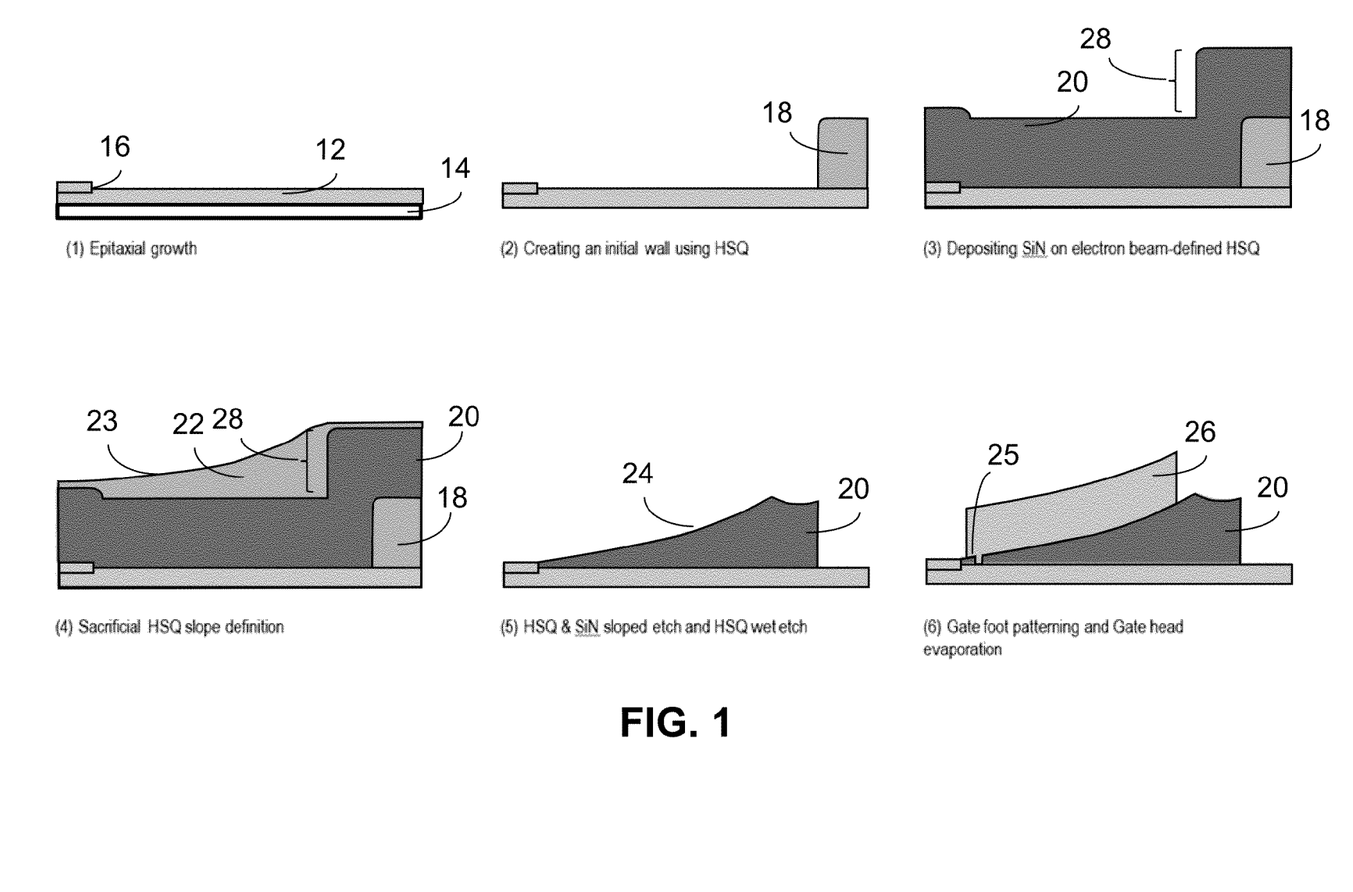
FIG. 1 shows a method of fabricating a slanted field plate gate in accordance with the present disclosure.

FIG. 1 shows a schematic of the sloped-etch field plate gate fabrication process. This process illustrates a process flow for GaN-based HEMT, but it is not limited to GaN and is applicable any FET and to other semiconductor materials such as GaAs, InP, Si, and InSb.

In step 1 of FIG. 1 epitaxy 12 is grown for a GaN-HEMT structure on a suitable substrate 14, such as sapphire, SiC, silicon, GaN, etc. Optionally, n+ GaN regrowth may be performed to provide low resistance ohmic contacts 16 for the FET source and drain. Then in step 2 a negative tone electron-beam resist, which may be a hydrogen silsesquioxane (HSQ) wall 18, is deposited and patterned using an electron beam. The HSQ wall 18 may have a composition that has a 50% to 100% HSQ concentration. The HSQ wall 18 is near the drain side of the FET, and may be between the gate and the drain. In FIG. 1, the left side of the device is the source side of the FET. Next in step 3, SiN 20 is deposited over a gate area and on the electron beam-defined HSQ wall 18. The dielectric SiN 20 may be deposited using plasma-enhanced chemical vapor deposition (PECVD). The SiN 20 deposited on the HSQ wall 18 creates a HSQ/SiN wall with a step height 28 near the drain side of the FET.

Then in step 4 HSQ 22 is deposited on the SiN 20 and surface tension causes the HSQ 22 to have a slope or slant 23 between the step height 28 and the source side of the FET. The slope or slant 23 may be concave up, and have an increasing slope as the distance increases from the source side of the FET. The slope or slant 23 may also have a constant angle. The HSQ 22 has a lower concentration of HSQ and a lower viscosity than the HSQ wall 18. The HSQ 22 may have a composition that has a 0.01% to 20% HSQ concentration. Next in step 5, a vertical anisotropic dry etch, which may be a flourine-based reactive ion etch, of the HSQ 22 and the SiN 20 is used to transfer slope 23 to the SiN 20 to form sloped portion 24 in the SiN 20. Wet etching may be used to remove HSQ wall 18. Then, in step 6, a gatefoot 25 is formed in the SiN 20 near the source end by etching, and a gatehead 26 is formed, which provides a gate connected slant field plate. The gatehead 26 may be formed by evaporating metal. In an optional step, a dielectric may be deposited on the gate 26.

Figure 2:
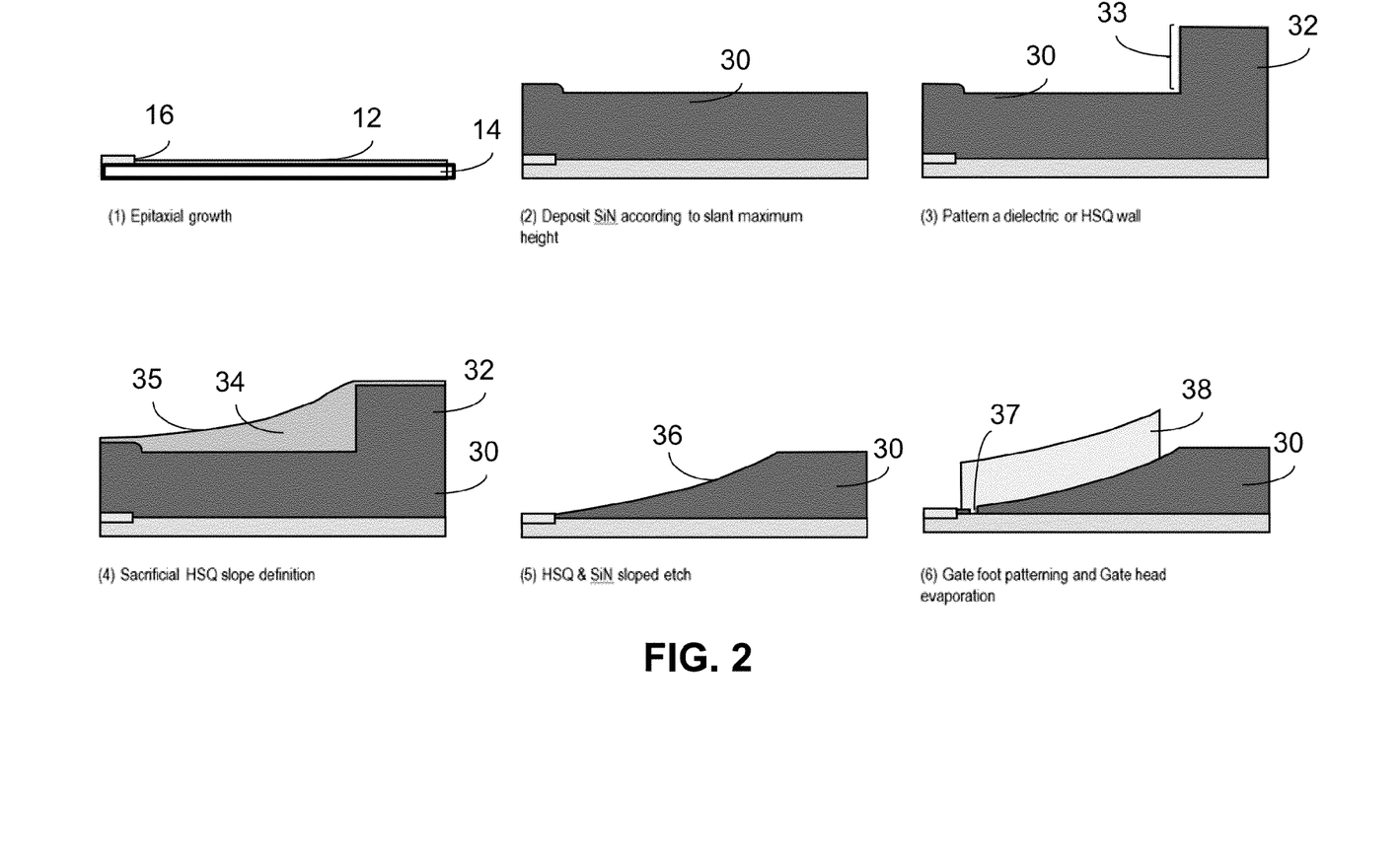
FIG. 2 shows an alternative method of fabricating a slanted field plate gate in accordance with the present disclosure.

FIG. 2 shows another process for creating a sloped field gate. This process reduces the number of e-beam lithography steps to only one for forming the gatefoot 25.

In step 1 of FIG. 2, epitaxy 12 is grown for a GaN-HEMT or any FET structure on a suitable substrate 14, such as sapphire, SiC, silicon, GaN, etc. Optionally, n+ GaN regrowth may be performed to provide low resistance ohmic contacts 16 for the source and drain. As in FIG. 1, the left side of the device shown in FIG. 2 is the source side of the FET. Then in step 2, SiN 30 is deposited by plasma-enhanced chemical vapor deposition (PECVD). The SiN may be deposited to have a thickness corresponding to a desired maximum slant height. Next in step 3, another dielectric 32, which may also be SiN, is patterned and deposited on the SiN 30 to create a wall near the drain side of the FET with a step height 33. The dielectrics 30 and 32 may be deposited using plasma-enhanced chemical vapor deposition (PECVD).

Next in step 4, HSQ 34 is deposited on the dielectric 32 and the SiN 30 and the surface tension causes the HSQ 34 to have a slope 35, which may be concave up. The HSQ 34 may have a composition that has a 0.01% to 20% HSQ concentration. Then in step 5, the HSQ 34, the dielectric 32 and the SiN 30 are anisotropically vertically etched, which may be performed with a flourine-based reactive ion etch, to form a sloped portion 36 in the SiN 30. Next in step 6, a gatefoot 37 is formed by etching, and a gatehead 38 is formed on the sloped portion 36 and provides a gate connected slant field plate. The gatehead 38 may be formed by evaporating metal. Optionally, a dielectric may be deposited on the gate 38.

Rather than using SiN as the dielectric in the above embodiments, other dielectrics such as $SiO_2$, SiON, SiCN, $Al_2O_3$ and $HfO_2$ may be used.

Figure 3A:
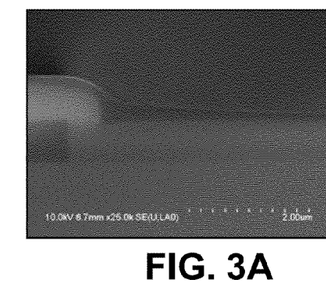
FIG. 3A shows a sloped hydrogen silsesquioxane (HSQ) coating after SiN is deposited on the initial HSQ layer.
Figure 3B:
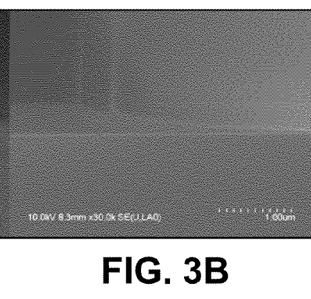
FIGS. 3B and 3C show the linear slope following the sloped etch in accordance with the present disclosure.
Figure 3C:
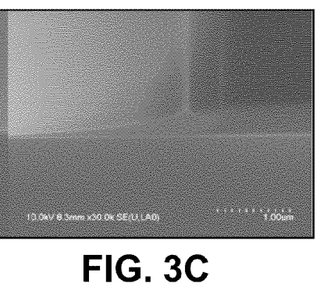

The scanning electron microscope (SEM) images shown in FIGS. 3A, 3B, and 3C, and FIGS. 4A, 4B, 4C and 4D demonstrate the feasibility of forming sloped etches in SiN. FIG. 3A shows the sloped HSQ coating after SiN is deposited on the initial HSQ layer. FIGS. 3B and 3C show the linear slope following the sloped etch.

Figure 4A:
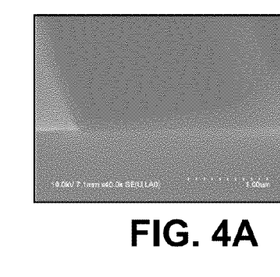
FIG. 4A shows a SEM image of a HSQ slope.
Figure 4B:
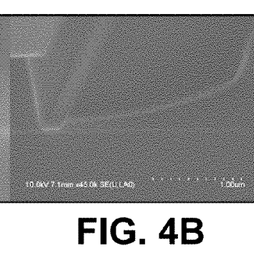
FIG. 4B shows a sloped etch.
Figure 4C:
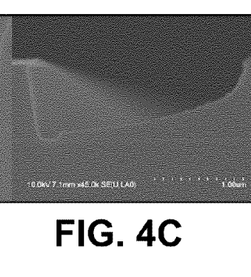
FIG. 4C shows a cross-sectional view of the sloped etch.
Figure 4D:
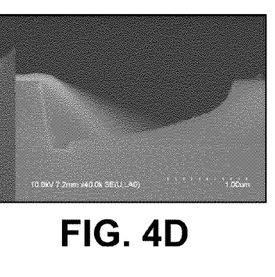
FIG. 4D shows a cross-sectional view of buffered oxide etch (BOE) treated slope in accordance with the present disclosure.

FIGS. 4A, 4B, 4C and 4D show SEM images of a demonstration of the sloped HSQ and sloped etch gate process using a dielectric stack of HSQ, an HSQ slope, and a sloped etch. The gatefoot etch and either atomic layer deposition (ALD) and gate plating or gate evaporation follow. FIG. 4A shows a SEM image of a HSQ slope, FIG. 4B shows a sloped etch, FIG. 4C shows a cross-sectional view of the sloped etch, and FIG. 4D shows a cross-sectional view of a slope that has been treated with a buffered oxide etch (BOE), which is a wet etch.

Figures 5, 6:
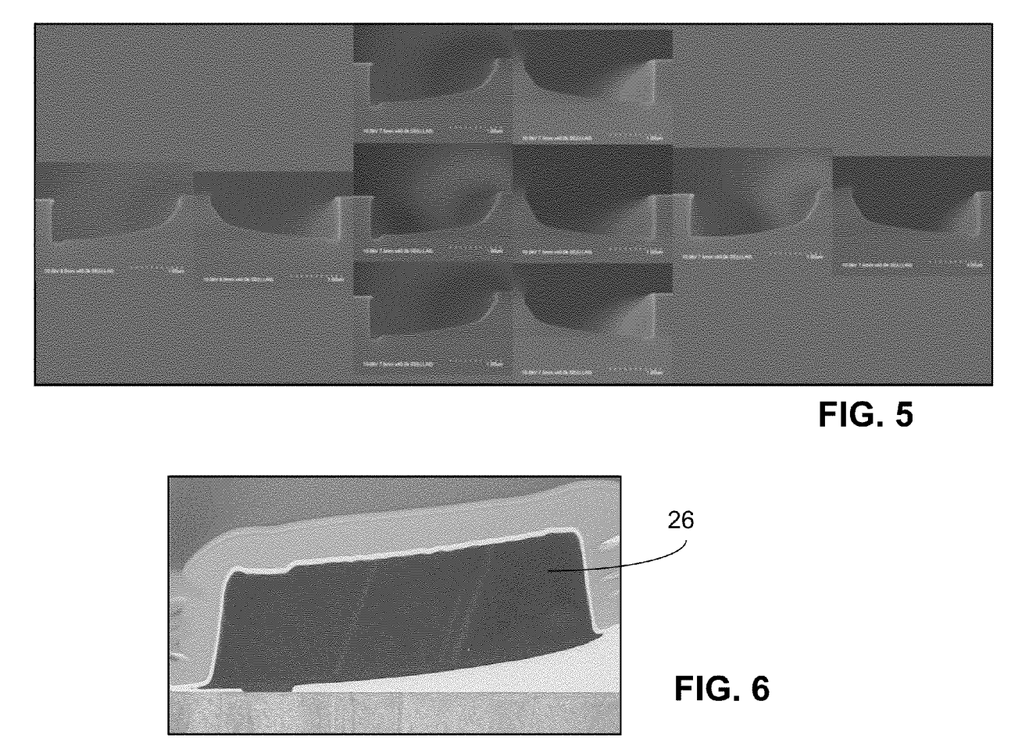
FIG. 5 shows the uniformity achieved for the sloped gate feature across a 3 inch single-side polished silicon wafer in accordance with the present disclosure.
FIG. 6 shows TEM cross-section of a completed sloped field plate gate on GaN in accordance with the present disclosure.

FIG. 5 shows the uniformity achieved for the sloped gate feature across a 3 inch single-side polished silicon wafer, and FIG. 6 shows a transmission electron microscope (TEM) cross-section of a completed sloped field plate gate 26 on GaN.

In the embodiments described above, sloped structures, such as slopes 23 and 35, are created by forming a wall to create a step height, such as step heights 28 and 33, respectively, and diluted HSQ with a concentration of 0.01% to 20% HSQ for HSQ 22 and 34, respectively. The slope angle of slopes 23 and 35 depends on the step height 28 or 33, respectively, on the surface tension of the HSQ 22 and 34, respectively, and on the etch selectivity of the HSQ 22 and 34 versus the etch selectivity of the dielectric SiN 20 and the dielectric SiN 30, respectively.

In another embodiment, a method of fabrication enables realization of slanted field plates of arbitrary angles and/or shape and therefore optimization of the electric field profile in the gate-drain region of the device. A slanted gate field plate greatly reduces the peak electric field and improves dynamic on-resistance. In this embodiment the field-plate profile may be asymmetric, thereby reducing parasitic capacitance and minimizing the source-gate spacing and on-resistance.

Rather than using a single step, this embodiment uses HSQ coated over multiple steps of arbitrary number, width, and height, thereby permitting fabrication of field plates of arbitrary angle and curvature. However, this embodiment does require an increased number of process steps and process time.

Many types of field-plate geometries have been implemented to improve breakdown voltage and reduce current collapse in GaN HFETs. While typical planar single- or multiple-field plate designs improve device performance, slanted field plates have been shown to provide an advantage over planar designs by further reducing the peak electric field. However, slanted field plates have been difficult to implement using conventional microfabrication techniques. Previously-reported methods have used an isotropic plasma etch to effectively "widen" the dielectric gate foot opening in a FET before metallization. Such methods result in a symmetric slanted opening and provide poor control over slant field plate angle and gate length, as well as exposure of the underlying epitaxial material to plasma, which may be fluorine-based.

Preferably, a field plate fabrication method allows asymmetric field plates of arbitrary slope and/or curvature to be formed, therefore allowing optimization of the electric field profile, gate-drain capacitance, etc. for a particular device design and application.

In this method of fabrication, a negative-tone electron-beam (EB) resist, which may be hydrogen silsesquioxane (HSQ), is coated over multiple dielectric or HSQ steps of arbitrary height or length to create a slant of arbitrary slope which is then replicated in an underlying dielectric layer using flourine-based reactive ion etching. This structure serves to support the gate metal of an HFET, creating a slanted gate field plate.

Figure 7A:
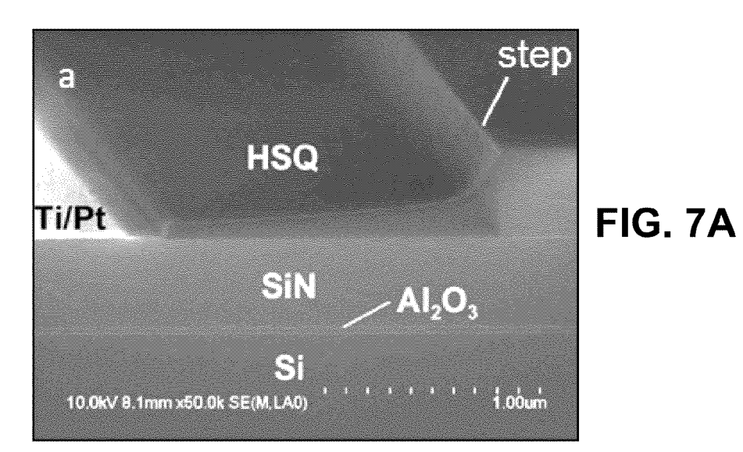
FIG. 7A shows a HSQ slope generated through surface tension forces by coating over a step.
Figure 7B:
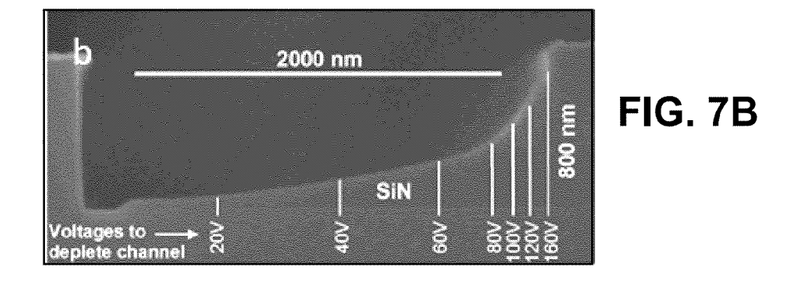
FIG. 7B shows a subsequent slope formed in an underlying PECVD SiN after reactive ion etching (RIE) etching, with corresponding calculated voltages to deplete the underlying electron channel in the AlGaN/GaN HEMT in accordance with the present disclosure.

The coating of HSQ over a step and replication of a slope into underlying dielectric material has been demonstrated. FIGS. 7A and 7B show cross-sectional SEM images of a slope created by spinning HSQ onto a patterned wafer and the resulting sloped dielectric layer formed over a step. In addition, the calculated drain-gate bias (Vdg) required to fully deplete the two-dimensional electron gas (2DEG) in the underlying AlGaN/GaN HEMT structure is shown in FIG. 7B. The curvature of the HSQ and therefore field plate decreases as the distance from the step increases. The field plate may also have no curvature and have a constant slant angle. The slant angle can be altered by adjusting the step height and is dependent on the relative etch rates of the HSQ versus the dielectric. In an example device with a gate-drain spacing of 2000 nm, as shown in FIG. 7B, the slant angle at the drain edge of the gate has been demonstrated to have a slant angle in a range of −8-16 degrees.

Figure 8:
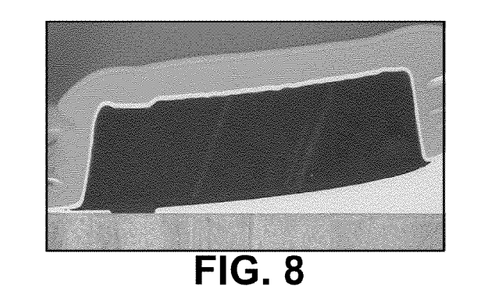
FIG. 8 shows a cross-sectional TEM image of a FET gate with a slant field plate formed by coating HSQ over a step and replication into underlying PECVD SiN in accordance with the present disclosure.

FIG. 8 shows a slant field-plate gate GaN HFET fabricated using the method of coating of HSQ over a single dielectric step. GaN HFETs fabricated in this way have been shown to have improved performance with respect to stepped or planar field plates due to the reduction of peak electric fields and parasitic capacitance.

The method of fabrication is shown in FIGS. 9A, 9B, 9C and 9D. In step 1, epitaxy 12 is grown on a suitable substrate 14, for example, for a AlGaN/GaN HEMT. Then in step 2, a PECVD is used to deposit a SiN dielectric passivation layer 40. The passivation layer 40 thickness depends on the desired slant angle and field plate length. For example, for a 45° slanted field plate with a length of 1 μm, the dielectric thickness may be on the order of 1-3 μm. Next in step 3, HSQ 42 is coated on the SiN 40 near the source side of the FET and patterned using electron beam lithography. Then in step 4, SiN 44 is conformally deposited using PECVD over HSQ 42 and passivation layer 40. Next in step 5, the SiN 44 and HSQ 42 are planarized using chemical-mechanical polishing (CMP). Steps 3-5 are then repeated an arbitrary number of times as shown in steps 6-9. In step 9, each planarized layer has a layer of HSQ, such as layers 42, 46, and 50, and a layer of SiN, such as layers 44, 48, and 52. Each succeeding planarized layer is offset from the last, so that SiN 44 has a wider lateral extent than SiN 48, which has a wider lateral extent than SiN 52.

Figure 9A:
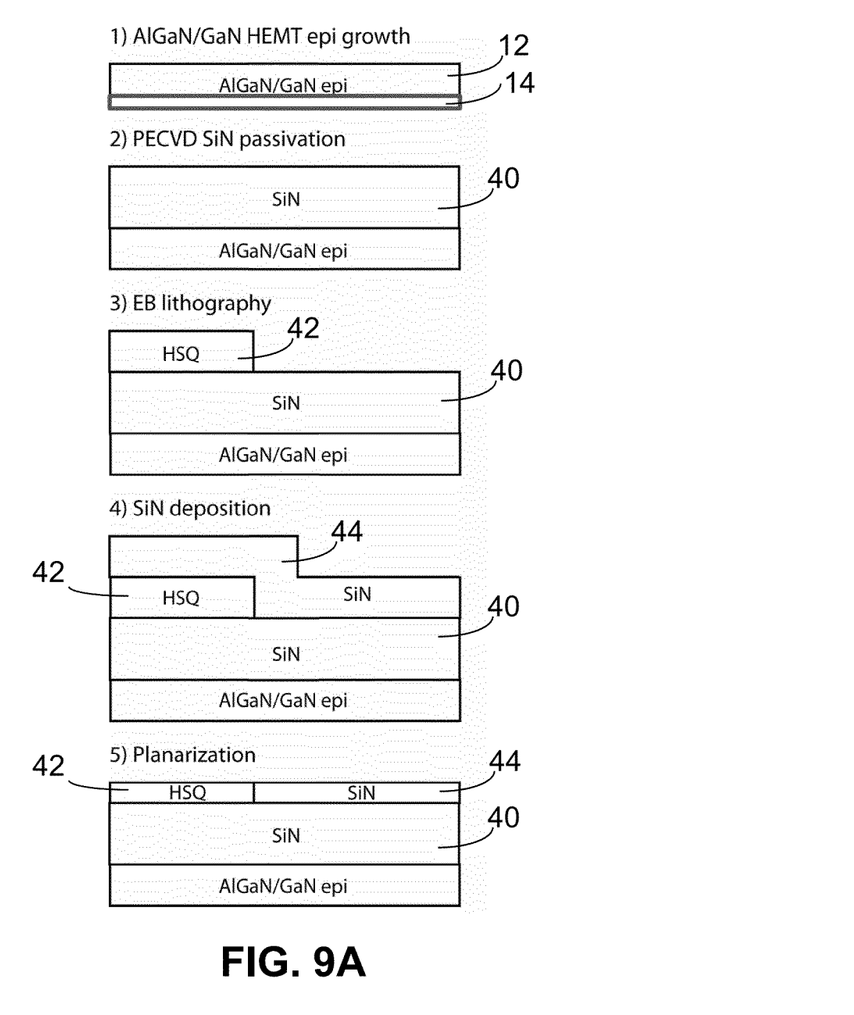
FIGS. 9A, 9B, 9C and 9D show a method of fabrication of a slanted gate field plate of arbitrary slope and curvature using multiple dielectric steps in accordance with the present disclosure.
Figure 9B:
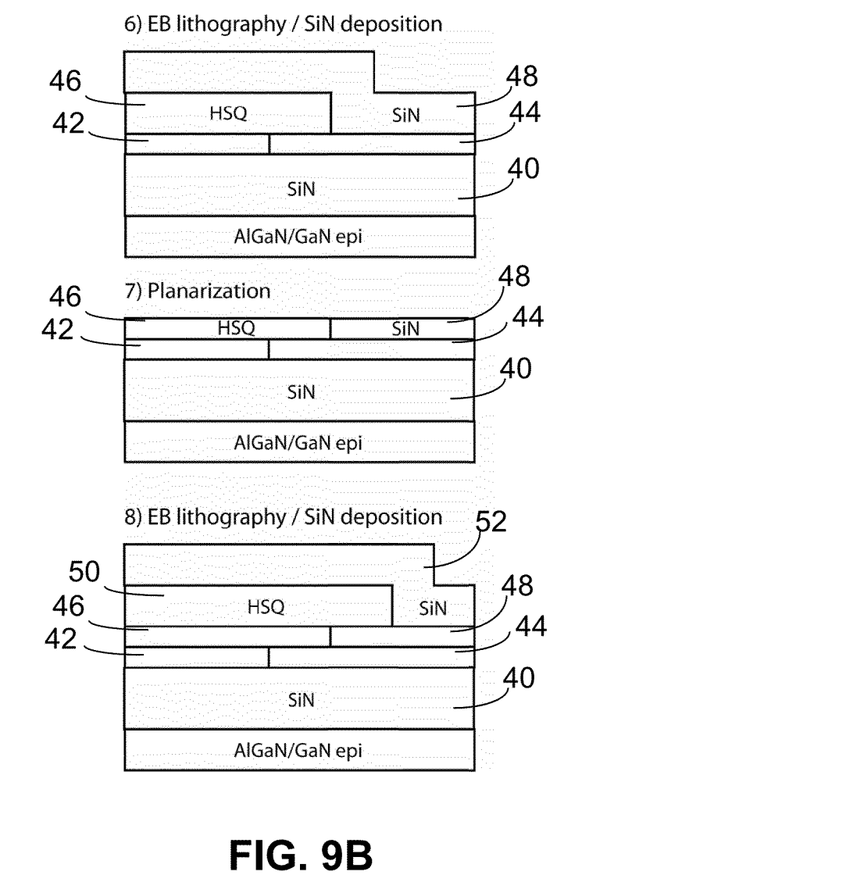
Figure 9C:
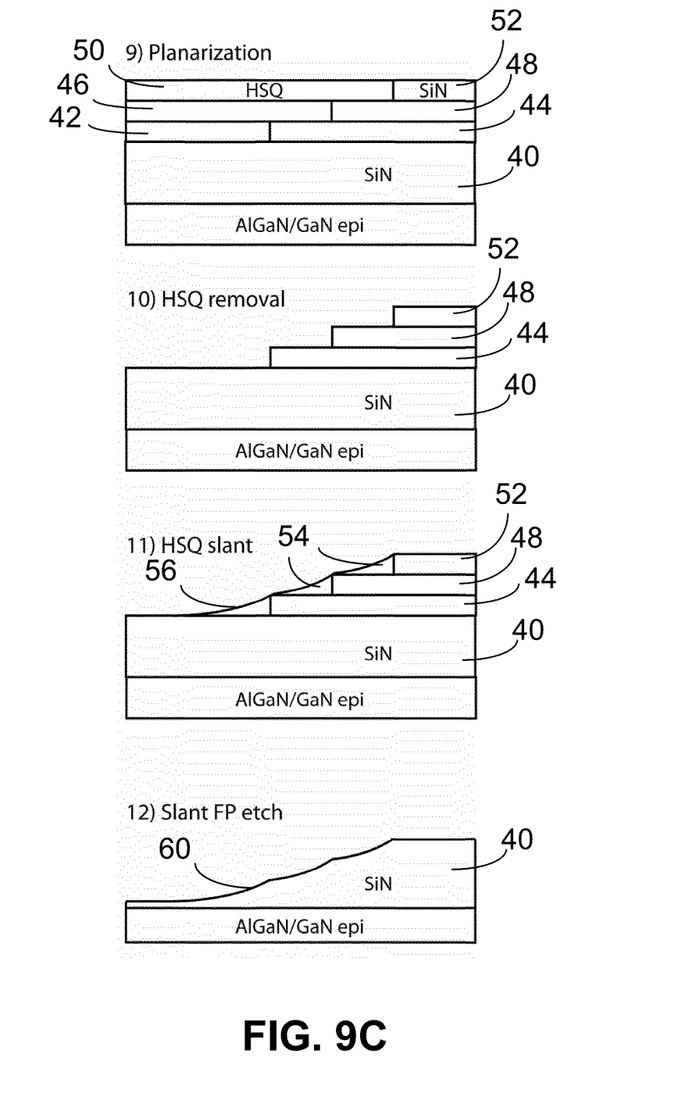

Then in step 10, the HSQ layers 42, 46 and 50 are removed by wet etching, leaving a series of SiN steps 44, 48 and 52. Three steps are shown in step 10; however, more or fewer could be implemented to optimize the resultant slope geometry. The thickness and spacing of the steps determine the ultimate slope angle and/or curvature of field plate. Following HSQ removal in step 10, the patterned SiN steps 44, 48 and 52 are coated with HSQ 54 to form a slant profile 56 via the surface tension phenomenon between each step, as shown in step 11. The HSQ 54 may be diluted to have a composition with a 0.01% to 20% concentration of HSQ. The slant profile 56 is then replicated into the underlying SiN dielectric by an anisotropic vertical tetrafluoromethane ($CF_4$) based reactive ion etch to form a slant profile 60 in the SiN 40, as shown in step 12.

Rather than using SiN as the dielectric in the above embodiments, other dielectrics such as $SiO_2$, SiON, SiCN, $Al_2O_3$ and $HfO_2$ may be used, and resists or spin-on dielectrics other than HSQ could be used in step 11 to create the slant profile; however, the etch rate of the coated material and the dielectric, such as SiN, must be similar so that a smooth profile is replicated in the underlying dielectric. A low etch selectivity of 1.1:1 has been measured for PECVD SiN and HSQ during CF4-based reactive ion etching.

The slant profile may be further smoothed after step 12 through the use of an isotropic chemical etch, for example by using an hydrogen fluoride (HF) based wet chemical etch.

Figure 9D:
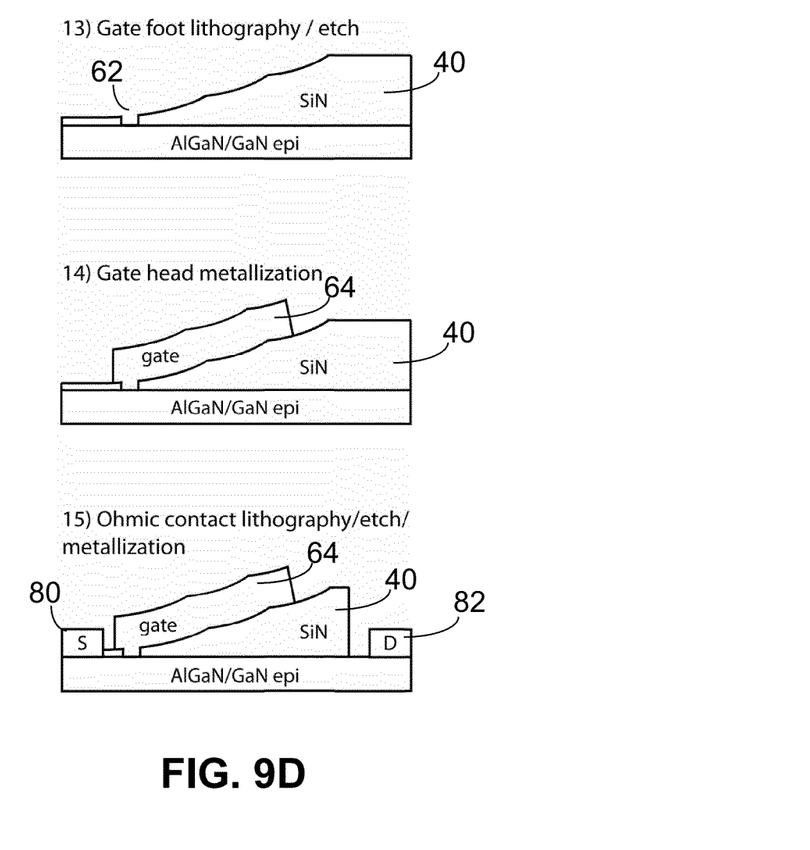

Next in step 13, a gatefoot 62 is patterned and etched into the remaining SiN 40. Then in step 14, gate metal 64 is deposited using standard microfabrication techniques of photolithography, evaporation, and liftoff. Finally, in step 15, Ohmic contact lithography, etching of the underlying dielectric, and metallization may be performed. Ohmic contacts 80 and 82 could alternatively be formed earlier in the process, such as immediately after epitaxial growth.

Figure 10:
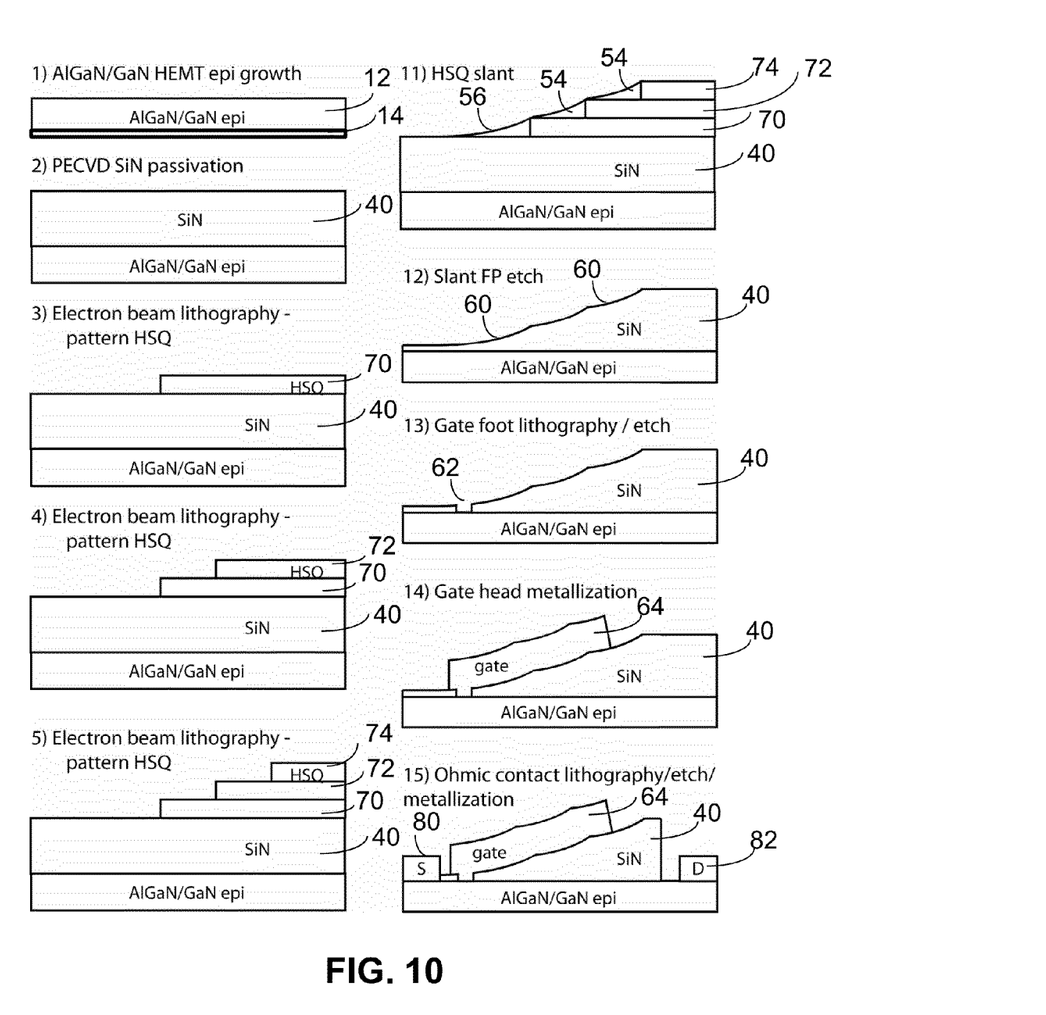
FIG. 10 shows an alternative method of fabrication of a slanted gate field plate of arbitrary slope and curvature using multiple HSQ steps in accordance with the present disclosure.

Another embodiment, which allows asymmetric field plates of arbitrary slope and/or curvature to be formed, is shown in FIG. 10. Steps 1 and 2 of FIG. 10 are the same as described above for FIG. 9A. In this process, multiple coats of HSQ are coated on the SiN 40 and HSQ steps 70, 72 and 74 are formed using electron-beam lithography, as shown in steps 3-5 of FIG. 10. Each coat of HSQ for HSQ steps 70, 72, and 74 has a composition that may have a concentration of 0.01% to 20% HSQ. Step 5 is followed by steps 11-15, which are the similar to steps 11-15 described above for FIGS. 9C and 9D, expect that in the case of FIG. 10 in step 11, HSQ 54 is formed on the HSQ steps 70, 72 and 74, rather than SiN steps 44, 48 and 52, as shown in FIG. 9C. The HSQ 54 forms a slant profile 56 between each step due to surface tension forces. Again the HSQ 54 has a composition that may have a concentration of 0.01% to 20% HSQ. Preferably, the HSQ steps 70, 72 and 74 and HSQ slant layer 54 all have the same concentration of HSQ.

In step 12, the HSQ 54, HSQ 74, HSQ 72, and HSQ 70 are anisotropically vertically dry etched to transfer the slope profile 56 to the SiN 40 forming the slope profile 60. In steps 13 and 14 the gatefoot 62 is formed, and the metal gate connected slant field plate 64 is formed. Step 15 shows a FET with a source and drain Ohmic contacts 80 and 82, respectively.

The advantages of the process of FIG. 10 over the process shown in FIGS. 9A, 9B, 9C and 9D include reduced processing time due to the elimination of dielectric deposition steps and chemical-mechanical polishing (CMP) steps. Also, a smoother slant profile 56 may be attained due to having an identical etch rate for the HSQ steps 70, 72 and 74 and HSQ slant layer 54.

The methods described above are applicable to many device types and semiconductor materials including GaN, GaAs, InP, Si, and InSb.

Having now described the present disclosure in accordance with the requirements of the patent statutes, those skilled in this art will understand how to make changes and modifications to the present invention to meet their specific requirements or conditions. Such changes and modifications may be made without departing from the scope and spirit of the present disclosure as disclosed herein.

The foregoing Detailed Description of exemplary and preferred embodiments is presented for purposes of illustration and disclosure in accordance with the requirements of the law. It is not intended to be exhaustive nor to limit the present disclosure to the precise form(s) described, but only to enable others skilled in the art to understand how the present disclosure may be suited for a particular use or implementation. The possibility of modifications and variations will be apparent to practitioners skilled in the art. No limitation is intended by the description of exemplary embodiments which may have included tolerances, feature dimensions, specific operating conditions, engineering specifications, or the like, and which may vary between implementations or with changes to the state of the art, and no limitation should be implied therefrom. Applicant has made this disclosure with respect to the current state of the art, but also contemplates advancements and that adaptations in the future may take into consideration of those advancements, namely in accordance with the then current state of the art. It is intended that the scope of the present disclosure be defined by the Claims as written and equivalents as applicable. Reference to a claim element in the singular is not intended to mean "one and only one" unless explicitly so stated. Moreover, no element, component, nor method or process step in this disclosure is intended to be dedicated to the public regardless of whether the element, component, or step is explicitly recited in the Claims. No claim element herein is to be construed under the provisions of 35 U.S.C. Sec. 112, sixth paragraph, unless the element is expressly recited using the phrase "means for . . . " and no method or process step herein is to be construed under those provisions unless the step, or steps, are expressly recited using the phrase "comprising the step(s) of . . . ."

What is claimed is:

1. A method of forming a slanted field plate comprising:
   forming epitaxy for a field effect transistor (FET) on a substrate;
   forming a wall on the epitaxy near a drain of the FET, the wall comprising a first negative tone electron-beam resist;
   depositing a dielectric over the epitaxy and the wall, the wall causing the dielectric to have a step near the drain of the FET;
   depositing a second negative tone electron-beam resist over the dielectric, wherein surface tension causes the deposited second negative tone electron-beam resist to have a slanted top surface between the step and a source of the FET;
   etching anisotropically vertically the second negative tone electron-beam resist and the dielectric to remove the second negative tone electron-beam resist and to transfer a shape of the slanted top surface to the dielectric between the step and the source of the FET; and
   forming a gatehead comprising metal on the dielectric between the step and the source of the FET;
   wherein the gatehead forms a slanted field plate.

2. The method of claim 1 wherein:
   the first negative tone electron-beam resist comprises hydrogen silsesquioxane (HSQ) having a 50% to 100% HSQ concentration; and
   the second negative tone electron-beam resist comprises HSQ having a 0.01% to 20% HSQ concentration.

3. The method of claim 1 wherein:
   a slant angle of the slanted field plate depends on a height of the step, and an etch rate of the second negative tone electron-beam resist versus an etch rate of the dielectric.

4. The method of claim 1 further comprising removing the first negative tone electron-beam resist using a wet etch.

5. The method of claim 1 wherein the dielectric comprises SiN, $SiO_2$, SiON, SiCN, $Al_2O_3$ or $HfO_2$.

6. The method of claim 1 further comprising:
   etching a gatefoot in the dielectric near the source;
   wherein forming the gatehead further comprises forming the gatehead in the gatefoot.

7. A method of forming a slanted field plate comprising:
   forming epitaxy for a field effect transistor (FET) on a substrate;
   depositing first dielectric on the epitaxy by plasma-enhanced chemical vapor deposition (PECVD), the first dielectric having a thickness corresponding to a desired maximum slant height;
   depositing a second dielectric on the first dielectric to form a wall near a drain of the FET;
   depositing a negative tone electron-beam resist on the first and the second dielectric, wherein surface tension causes the deposited negative tone electron-beam resist to have a slanted top surface between the wall and a source of the FET;
   etching anisotropically vertically the negative tone electron-beam resist, the first dielectric and the second dielectric to remove the negative tone electron-beam resist and to transfer a shape of the slanted top surface to the first dielectric between the wall and the source of the FET; and
   forming a gatehead comprising metal on the dielectric between the wall and the source of the FET;
   wherein the gatehead forms a slanted field plate.

8. The method of claim 7 wherein the negative tone electron-beam resist comprises hydrogen silsesquioxane (HSQ) having a 0.01% to 20% HSQ concentration.

9. The method of claim 7 wherein the first and the second dielectric comprises SiN, $SiO_2$, SiON, SiCN, $Al_2O_3$ or $HfO_2$, and the second dielectric is deposited using plasma-enhanced chemical vapor deposition (PECVD).

10. The method of claim 7 further comprising:
    etching a gatefoot in the first dielectric near the source;
    wherein forming the gatehead further comprises forming the gatehead in the gatefoot.

11. The method of claim 7 wherein:
    a slant angle of the slanted field plate depends on a height of the step, and an etch rate of the negative tone electron-beam resist versus an etch rate of the first dielectric.

12. A method of forming a slanted field plate comprising:
forming epitaxy for a field effect transistor (FET) on a substrate;
depositing a first dielectric on the epitaxy;
forming first negative tone electron-beam resist on the first dielectric near a source of the FET;
depositing second dielectric over the first dielectric and the first negative tone electron-beam resist;
planarizing the second dielectric and the first negative tone electron-beam resist using chemical-mechanical polishing (CMP);
forming second negative tone electron-beam resist on the over the first negative tone electron-beam resist and the second dielectric near a source of the FET, the second negative tone electron-beam resist having a longer lateral length than the first negative tone electron-beam resist;
depositing third dielectric over the second dielectric and the second negative tone electron-beam resist;
planarizing the third dielectric and the second negative tone electron-beam resist using chemical-mechanical polishing (CMP);
removing the first negative tone electron-beam resist and the second negative tone electron-beam resist by wet etching, wherein the second dielectric forms a first step from the first dielectric, and the third dielectric forms a second step from the second dielectric;
depositing third negative tone electron-beam resist over the first, second and third dielectric, wherein surface tension causes the deposited third negative tone electron-beam resist to have a slanted top surface between the first step and a source of the FET, and between the second step and the first step;
etching anisotropically vertically the third negative tone electron-beam resist and the first, second and third dielectric to remove the third negative tone electron-beam resist and to transfer a shape of the slanted top surface to the first, second and third dielectric between the second step and the source of the FET; and
forming a gatehead comprising metal on the first, second and third dielectric between the second step and the source of the FET;
wherein the gatehead forms a slanted field plate.

13. The method of claim 12 wherein:
the third negative tone electron-beam resist comprises hydrogen silsesquioxane (HSQ) having a 0.01% to 20% HSQ concentration.

14. The method of claim 12 wherein the first, second and third dielectric comprises SiN, $SiO_2$, SiON, SiCN, $Al_2O_3$ or $HfO_2$, and the dielectric is deposited using plasma-enhanced chemical vapor deposition (PECVD).

15. The method of claim 12 further comprising:
etching a gatefoot in the first dielectric near the source;
wherein forming the gatehead further comprises forming the gatehead in the gatefoot.

16. The method of claim 12 wherein etching anisotropically vertically comprises tetrafluoromethane ($CF_4$) based reactive ion etching.

17. The method of claim 12 further comprising smoothing the shape of the slanted top surface by using an isotropic chemical etch.

18. A method of forming a slanted field plate comprising:
forming epitaxy for a field effect transistor (FET) on a substrate;
depositing a dielectric on the epitaxy;
forming a first negative tone electron-beam resist on the dielectric near a drain of the FET to form a first step;
depositing second negative tone electron-beam resist dielectric over the first negative tone electron-beam resist and near a drain of the FET to form a second step, the second negative tone electron-beam resist having a lateral length less than the first negative tone electron-beam resist;
depositing third negative tone electron-beam resist over the first and second negative tone electron-beam resist, wherein surface tension causes the deposited third negative tone electron-beam resist to have a slanted top surface between the first step and a source of the FET, and between the second step and the first step;
etching anisotropically vertically the first, second and third negative tone electron-beam resist to remove the first, second and third negative tone electron-beam resist and to transfer a shape of the slanted top surface to the dielectric between the second step and the source of the FET; and
forming a gatehead comprising metal on the dielectric between the second step and the source of the FET;
wherein the gatehead forms a slanted field plate.

19. The method of claim 18 wherein:
the first, second and third negative tone electron-beam resist comprise HSQ having a 0.01% to 20% HSQ concentration.

20. The method of claim 18 wherein the dielectric comprises SiN, $SiO_2$, SiON, SiCN, $Al_2O_3$ or $HfO_2$.

21. The method of claim 18 further comprising:
etching a gatefoot in the dielectric near the source;
wherein forming the gatehead further comprises forming the gatehead in the gatefoot.

22. The method of claim 18 wherein etching anisotropically vertically comprises tetrafluoromethane ($CF_4$) based reactive ion etching.

23. The method of claim 18 further comprising smoothing the shape of the slanted top surface by using an isotropic chemical etch.

* * * * *